US008513708B2

(12) United States Patent
Chang et al.

(10) Patent No.: US 8,513,708 B2
(45) Date of Patent: Aug. 20, 2013

(54) INTEGRATED CIRCUIT FOR VARIOUS PACKAGING MODES

(75) Inventors: Hsien Chun Chang, HsinChu (TW);
Chia Lung Hung, HsinChu (TW);
Tsung Chi Lin, HsinChu (TW); Tzuo Bo Lin, HsinChu (TW)

(73) Assignee: Realtek Semiconductor Corp., Hsinchu (TW)

( * ) Notice: Subject to any disclaimer, the term of this patent is extended or adjusted under 35 U.S.C. 154(b) by 921 days.

(21) Appl. No.: 12/127,265

(22) Filed: May 27, 2008

(65) Prior Publication Data

US 2008/0290375 A1    Nov. 27, 2008

(30) Foreign Application Priority Data

May 25, 2007  (TW) .............................. 96118883 A

(51) Int. Cl.
*H01L 27/10*  (2006.01)
(52) U.S. Cl.
USPC .......................................... 257/203; 257/776
(58) Field of Classification Search
USPC ..................... 257/203, 776, E29.12, E29.246
See application file for complete search history.

(56) References Cited

U.S. PATENT DOCUMENTS

| | | | |
|---|---|---|---|
| 4,990,996 A | 2/1991 | Kumar et al. | |
| 2005/0184398 A1* | 8/2005 | Zhou et al. | ..................... 257/777 |
| 2008/0272478 A1* | 11/2008 | Anderson et al. | ............. 257/686 |

FOREIGN PATENT DOCUMENTS

| | | |
|---|---|---|
| JP | 2000243907 A | 9/2000 |
| JP | 2003332376 A | 11/2003 |
| JP | 2007053370 A | 3/2007 |
| TW | I244189 | 11/2005 |
| TW | M294736 | 7/2006 |

OTHER PUBLICATIONS

English translation of abstract of JP 2003332376 A.
English translation of abstract of JP 2007053370 A.
English translation of abstract of JP 2000243907 A.

* cited by examiner

*Primary Examiner* — Cuong Q Nguyen
(74) *Attorney, Agent, or Firm* — McClure, Qualey & Rodack, LLP

(57) ABSTRACT

The present invention provides an integrated circuit suitable for various packaging modes. This integrated circuit includes: a core circuit, a plurality of pads, and a selection circuit. The selection circuit is coupled between the core circuit and the pads for determining the connection state between the core circuit and the pads based on a control signal. When the control signal provides a first value, the core circuit and the pads will be in a first connection state, and the integrated circuit will be applied with a single-die package. However, when the control signal provides a second value, the core circuit and the pads will be in the second connection state, and the integrated circuit will be applied with a multi-die package.

13 Claims, 11 Drawing Sheets

INTEGRATED CIRCUIT FOR VARIOUS PACKAGING MODES

CROSS-REFERENCES TO RELATED APPLICATIONS

This non-provisional application claims priority under 35 U.S.C. §119(a) on Patent Application No(s). 096118883 filed in Taiwan, R.O.C. on May 5, 2007, the entire contents of which are hereby incorporated by reference.

FIELD OF INVENTION

The present invention relates to an integrated circuit, and particularly to an integrated circuit suitable for various packaging modes.

BACKGROUND

The manufacture of integrated circuits (IC) pushes toward the trend of making products compact and integrated. One of the targets of IC design is to combine multiple functions into a single IC such that the capability of systemization is provided. However, an IC with multiple functions integrated will possibly result in overcomplicated processing steps accompanied with huge die area, causing a reduction of product yield. Therefore, processes with different functions or with integration hardship will be separated into different dies for manufacturing. A multi-die packaging technique is then employed for the packaging of dies with various functions into a single package, so that the purpose of systemization is achieved.

Please refer to FIG. 1, which is a conventional single-die packaging structure. A logic die 110 (or a mixed signal die) is configured with pad 120, which will be connected to lead 130 of a package body (not shown) through the bonding wire constituting the I/O pins of the entire package.

Please refer to FIG. 2, which is a conventional multi-die packaging structure. FIG. 2 shows a memory die 150 configured above die 110 in the packaging structure. Die 110 is configured with a set of pads 120 for connecting to lead 130 of the package body (not shown). Die 110 is configured with another set of pads 122 for providing a connection to pad 160 of die 150 so that die 110 can access the data on die 150, which resides within the same package. It should be noted that die 150 can also have another set of pads 162 for connecting to lead 130 of the package body although they are not shown in the figure.

The cost of optical masks and wafers, which increases rapidly, concurs with the progress of fabrication technology. Therefore, a minimum amount of sales is required to maintain the regular profit. However, consumer electronics varies insignificantly in detailed specifications such that a single type of product may only have a very limited market scale. The following are a few features to consider when selecting packages for conventional dies: 1. Dies of the same package type with different number of pins; 2. Dies with the same number of pins, but connected externally by different pads for different functions, such as the data pin outputs of a 32-bit DRAM (Dynamic Random Access Memory) supporting external 32-bit DRAM, and data pin outputs of a 16-bit DRAM supporting only external 16-bit DRAM; 3. Dies with the same number of pins, but with different internal circuit functions selected through the internal pad links. For example, if a certain pad is linked to the voltage source pin (VDD Pin), the 32-bit DRAM is supported; if linked to the ground pin (GND Pin), the 16-bit DRAM is supported instead. This is referred as a bonding option. Nonetheless, current designs provide only one type of packaging, which includes the single-die packaging or the multi-die packaging. Manufacturers would have to provide a variety of pad counts for different circuit layouts in order to satisfy clients' needs. Therefore, the overall cost for IC manufacturing can hardly be reduced.

SUMMARY OF THE INVENTION

In view of above-mentioned problems, one of the objects of the present invention is to provide an integrated circuit suitable for various packaging modes.

One of the objects of the present invention is to provide an integrated circuit for various packaging modes. This enables the production of a die supporting different applications by selecting different signals based on different packages.

One of the objects of the present invention is to provide an integrated circuit suitable for various packaging modes, improving application flexibility.

One of the objects of the present invention is to provide an integrated circuit that share pads.

One of the objects of the present invention is to provide an integrated circuit with reduced number of pads.

One of the objects of the present invention is to provide an integrated circuit with reduced die area.

The present invention provides an integrated circuit suitable for various packaging modes. The integrated circuit includes a core circuit, pads, and a selection module. The selection module is coupled between the core circuit and the pads, including selection circuits for determining the connection state between the core circuit and the pads, which is based on a control signal. When the control signal supplies a first value, the core circuit and the pads are in the first connection state and the integrated circuit will be used in a single-die package. When the control signal supplies a second value, the core circuit and the pads are in the second connection state and the integrated circuit will be used in a multi-die package.

The features and implementations regarding the present invention will be further explained by the detailed description for the preferred embodiments associated with the figures as follows.

DETAILED DESCRIPTION OF THE PREFERRED EMBODIMENTS

The embodiments set forth below are accompanied with supplementary figures for detailed descriptions of the present invention. The symbols referred in the description correspond to those illustrated in the figures.

Figure 1:
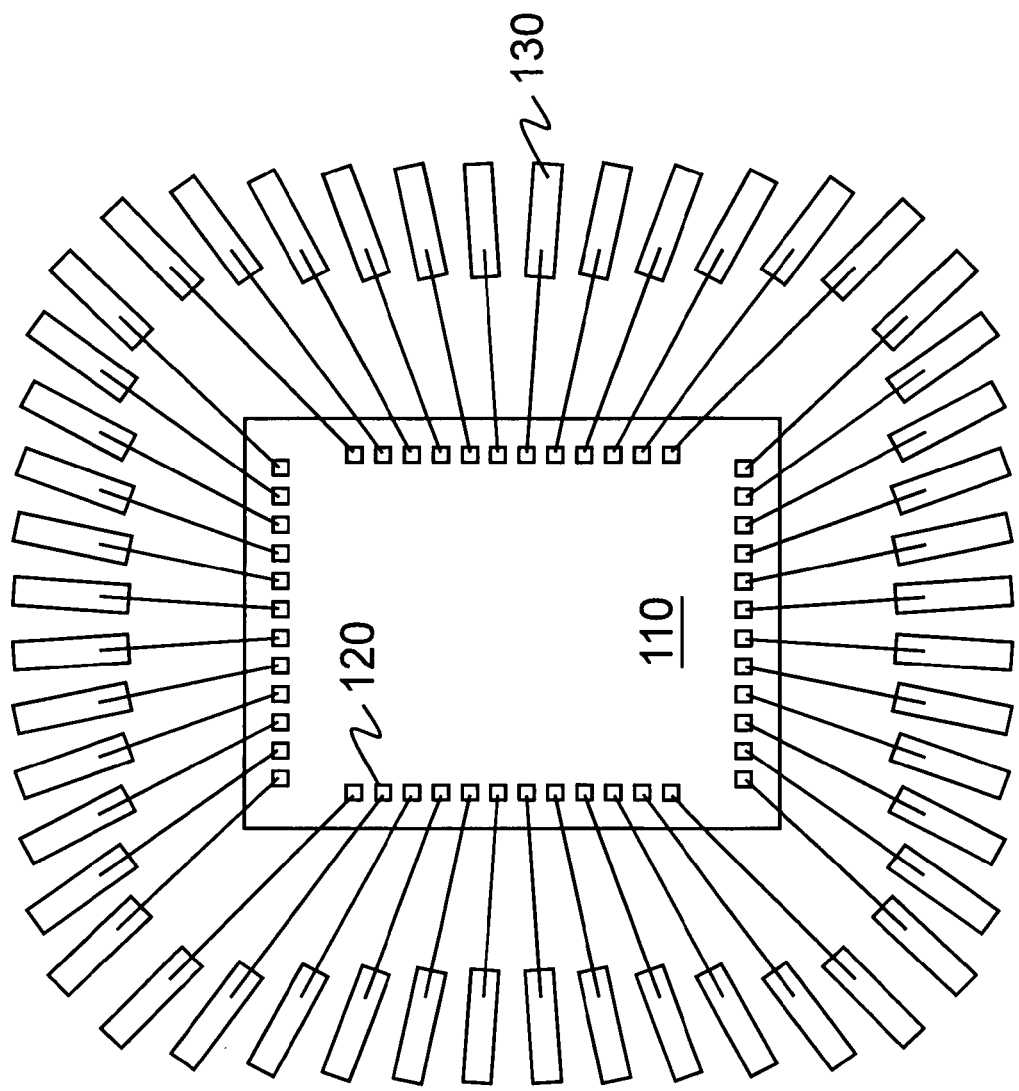
FIG. 1 is a diagram of a conventional single-die packaging structure.
Figure 2:
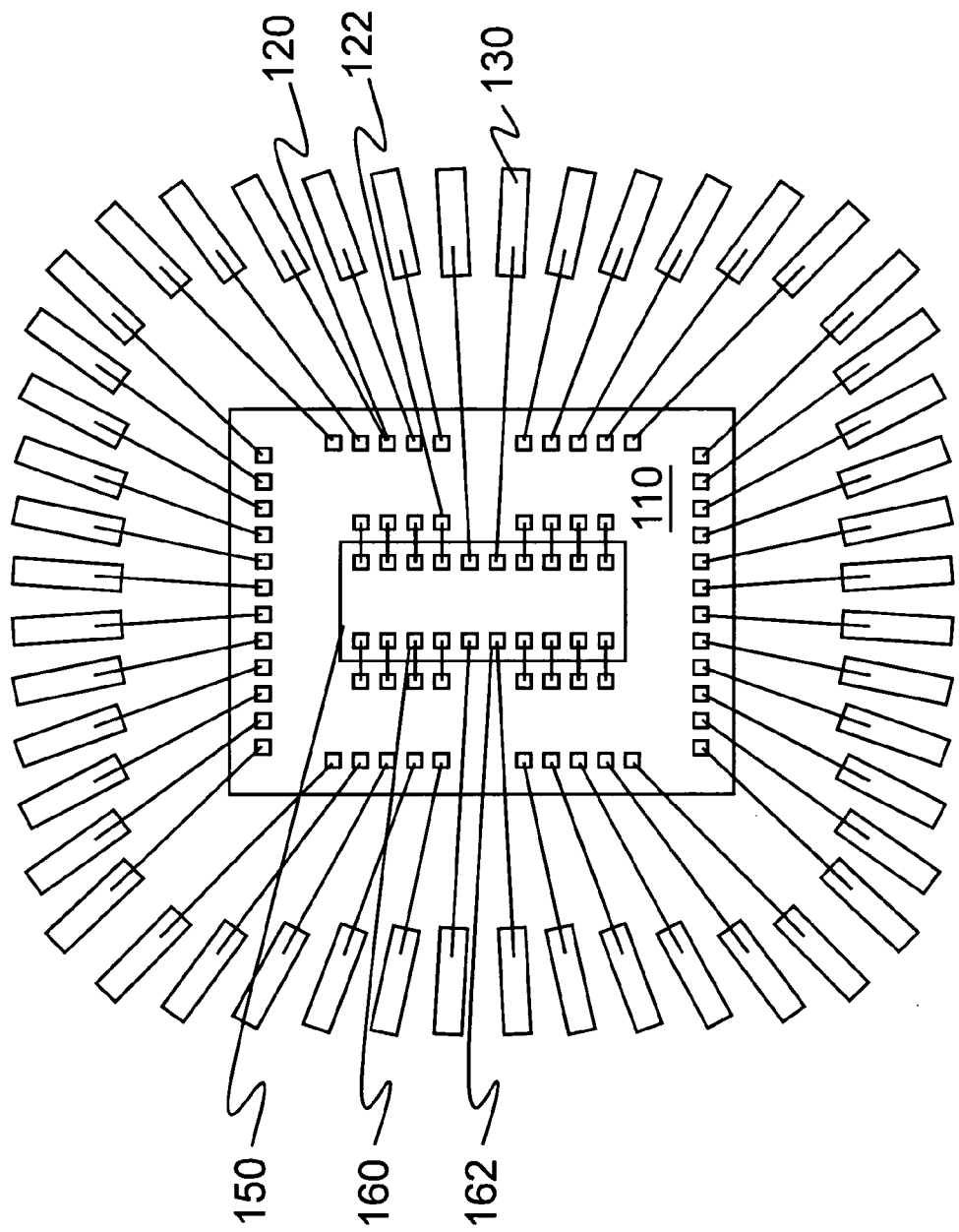
FIG. 2 is a diagram of a conventional multi-die packaging structure.
Figure 3:
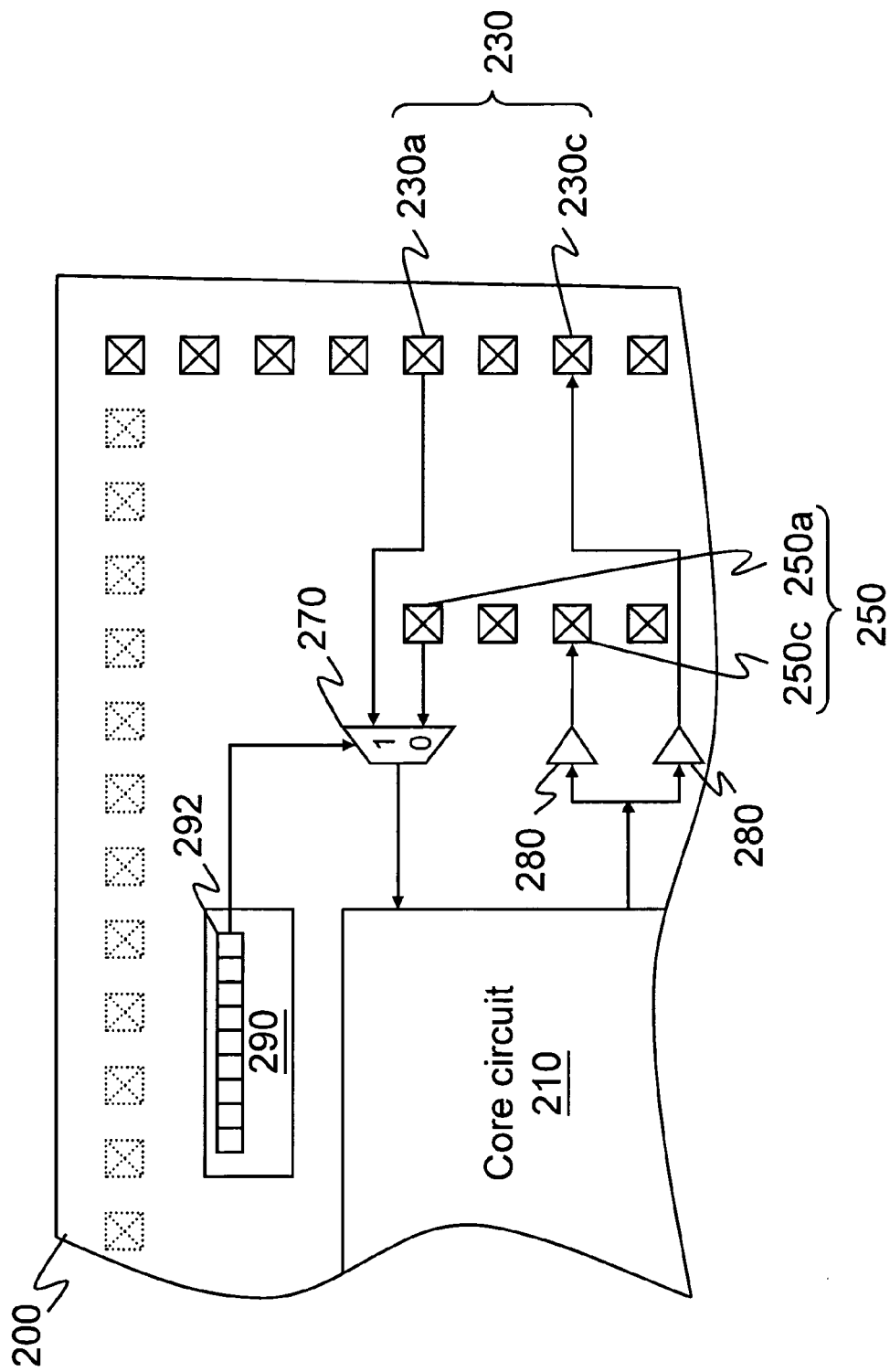
FIG. 3 is a diagram of an integrated circuit as a first embodiment of the present invention.

Please refer to FIG. 3, which is an integrated circuit 200 illustrated according to an embodiment of the present invention. The integrated circuit 200 is suitable for a variety of packaging modes, such as single-die packaging, multi-die packaging, etc. The integrated circuit 200 of an embodiment includes a core circuit 210, pads 230, 250, a selection circuit 270, and a control circuit 290.

The core circuit 210 provides main core functions of an integrated circuit. Generally speaking, the core circuit 210 may have one or more inputs and/or outputs. In the present embodiment, the input of the core circuit 210 is coupled to the selection circuit 270 in order to choose the desired packaging mode. The selection circuit 270 is coupled in between the two pads 230a, 250a and the input of the core circuit 210, whereas the output of the core circuit 210 is coupled to the other two pads 230c, 250c. The control circuit 290 generates a control signal, which is based on the packaging mode of integrated circuit 200. The control circuit 290 outputs the control signal to the selection circuit 270 so that selection circuit 270 will electrically connect the input of the core circuit 210 to one of the 230a, 250a pads. The control circuit 290 may include a register 292, which may store parameters that are required for determining the packaging modes of the integrated circuit 200, thereby outputting the appropriate control signal to the selection circuit 270. The values stored in the register 292 can be overwritten by firmware or software. Nonetheless, the present invention does not intend to limit that the control signal is determined by means of the control circuit 290 with parameters in the register 292 only. Other configurations, which include additional parameters such as bonding options and other common mode selection mechanisms, can also be used.

Figure 4:
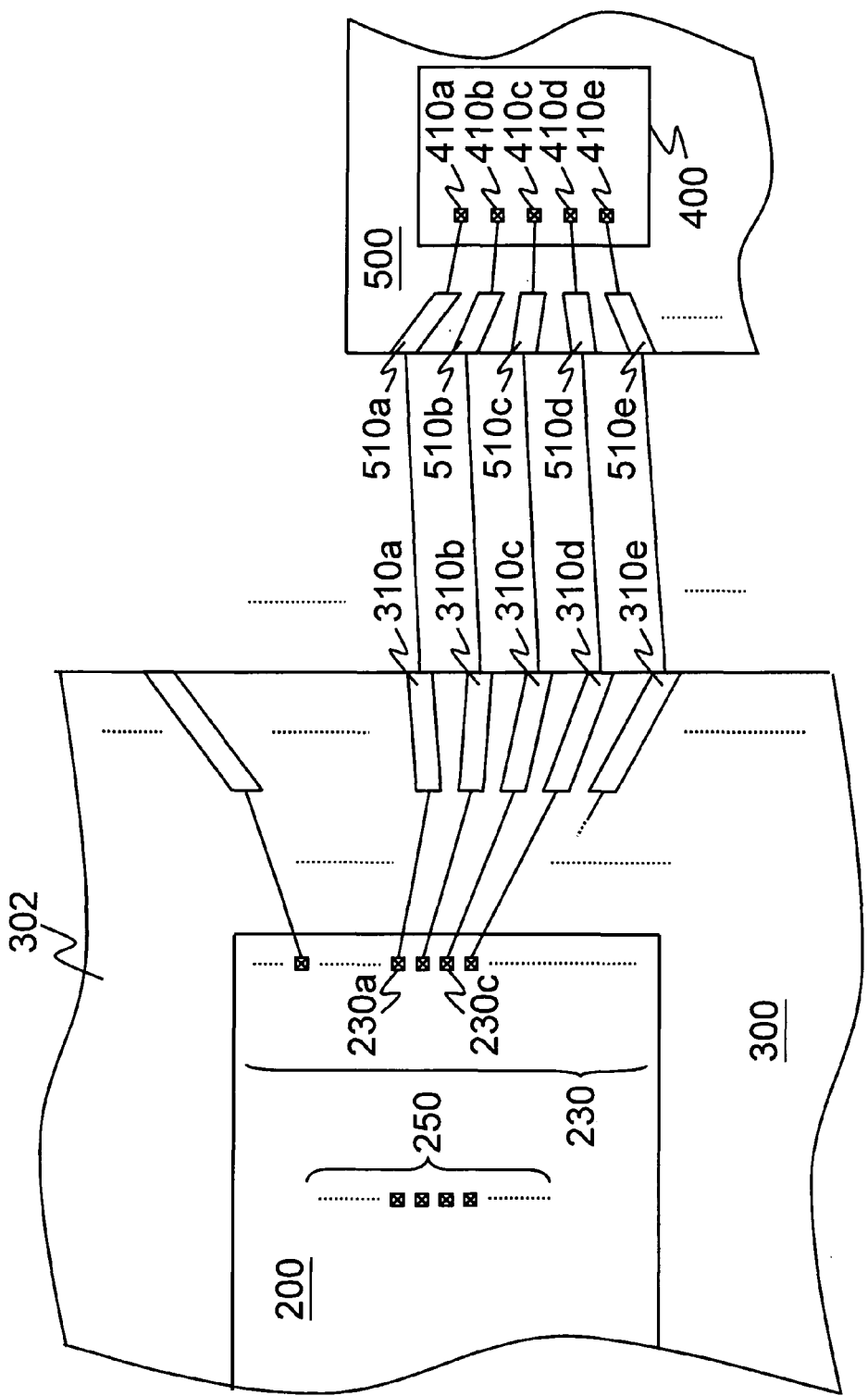
FIG. 4 is a structural diagram of an integrated circuit in FIG. 3 within a single-die packaging.

Thus, the integrated circuit 200 can be applied in various packaging modes. For example, when the integrated circuit 200 (hereinafter referred as the first integrated circuit 200 for convenience) is applied with a single-die package (referring to FIGS. 3 and 4), the first integrated circuit 200 on substrate 302 of the first package body 300 may employ bonding techniques to connect electrically the pad 230 of the first integrated circuit 200 with another package body (hereinafter referred as the second package body 500 for convenience) through leads 310a, 310b, 310c, 310d, 310e on substrate 302. The first package body 300 and the second package body 500 are generally arranged on a printed circuit board by wiring connections of the individual leads 310a, 310b, 310c, 310d, 310e/510a, 510b, 510c, 510d, 510e. The second package body 500 may be an SDRAM (Synchronous Dynamic Random Access Memory), but not limited herein, and may have another integrated circuit (hereinafter referred as the second integrated circuit 400 for convenience) residing thereon. In other words, the pads 230 of the first integrated circuit 200 is connected to pads 410a/410b/410c/410d/410e on the second integrated circuit 400 through leads 310a/310b/310c/310d/ 310e of the first package body 300, leads 510a/510b/510c/ 510d/510e of the second package body 500, and the circuit board wiring among them. FIG. 4 illustrates an example showing that the pad 230a is connected to pad 410a through lead 310a and lead 510a. At this time, the selection circuit 270 will connect the input of the core circuit 210 to the pads 230 electrically.

Figure 5:
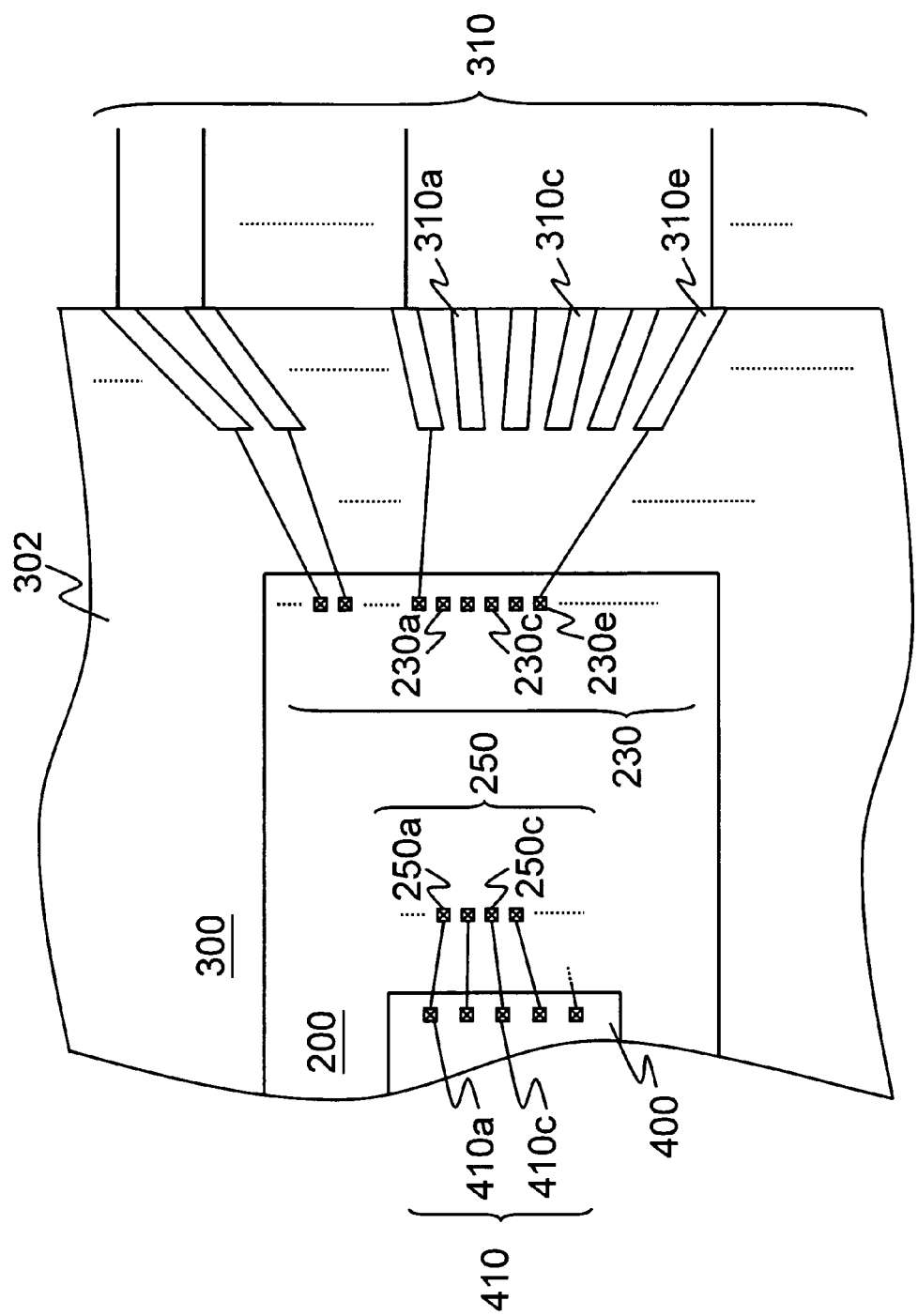
FIG. 5 is a structural diagram of an integrated circuit in FIG. 3 within a multi-die packaging.

When the integrated circuit 200 (hereinafter referred as the first integrated circuit 200 for convenience) is applied with a multi-die package (referring to FIGS. 3 and 5), the first integrated circuit 200 is to be interconnected with another integrated circuit (hereinafter referred as the second integrated circuit 400 for convenience), such as a memory die by means of pad 250 and pad 410. The pads 230 of the first integrated circuit 200 will partially correspond to the pads 250, by means of connections being made to the same selection circuit 270 or the same signal output. The first integrated circuit 200 on the substrate 302 of the first package body 300 employs the pads of pads 230 that are not coupled to the pads 250 by connecting them electrically to the leads 310. For example, pad 250a is coupled to pad 410a, and as a result, corresponding pad 230a of pad 250a will not be connected electrically to lead 310a. However, corresponding pad 230e of pad 250e will be connected electrically to lead 310e since pad 250e is not coupled to pad 410e. At this time, the selection circuit 270 will connect the input of the core circuit 210 to the pads 250 electrically.

In other words, the pads 230 and the pads 250 can be separately coupled to external circuitry and to another internal die, respectively. In single-die packaging, the selection circuit 270 will connect the input of the core circuit 210 to the first pad electrically, i.e. pad 230a, based on the received control signal. In multi-die packaging, the selection circuit 270 will connect the input of the core circuit 210 to the second pad electrically, i.e. pad 250a, also based on the received control signal.

Furthermore, a buffer 280 may be coupled between the output of the core circuit 210 and pads 230c, 250c for buffering, or for the enhancement of driving the signal that is to be outputted by the core circuit 210.

The selection circuit 270 can be implemented with a multiplexer. The inputs of the multiplexer can be connected to pads 230a, 250a, and an output of the multiplexer can be connected to the input of the core circuit 210, and the control terminal can be connected to the control circuit 290 for receiving the control signal. For example, when the integrated circuit 200 is for single-die packaging, the control circuit 290 will output a control signal representing "1" to the selection circuit 270, so that the selection circuit 270 will connect the input of the core circuit 210 with the pad 230a electrically. On the other hand, when applied with multi-die packaging, the control circuit 290 will output a control signal representing "0" to the selection circuit 270, so that the selection circuit 270 will connect the input of the core circuit 210 with the pad 250a electrically.

Figure 6:
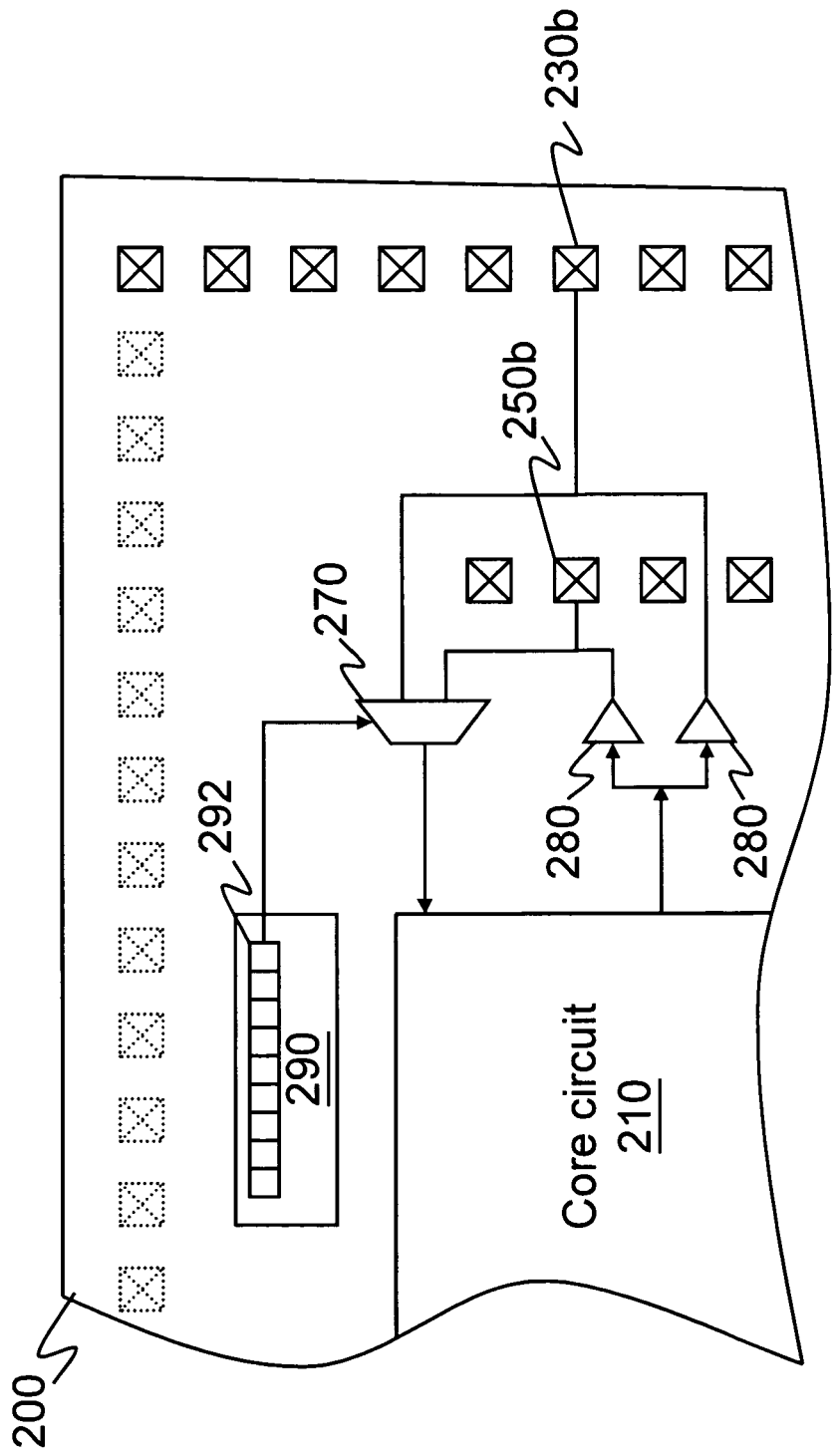
FIG. 6 is a diagram of an integrated circuit as a second embodiment of the present invention.

The pads 230 and the pads 250 may be used for unidirectional transmission, as shown in FIG. 3, or for bidirectional transmission, as shown in FIG. 6. When adopting the pads 230, 250 for unidirectional transmission, the output of the core circuit 210 and the selection circuit 270 will be coupled to different pads 230c, 250c/230a, 250a, as shown in FIG. 3. However, when adopting pads 230, 250 for bidirectional transmission, the output of core circuit 210 and selection circuit 270 will be coupled to the same pads 230b, 250b, as shown in FIG. 6.

Figure 7:
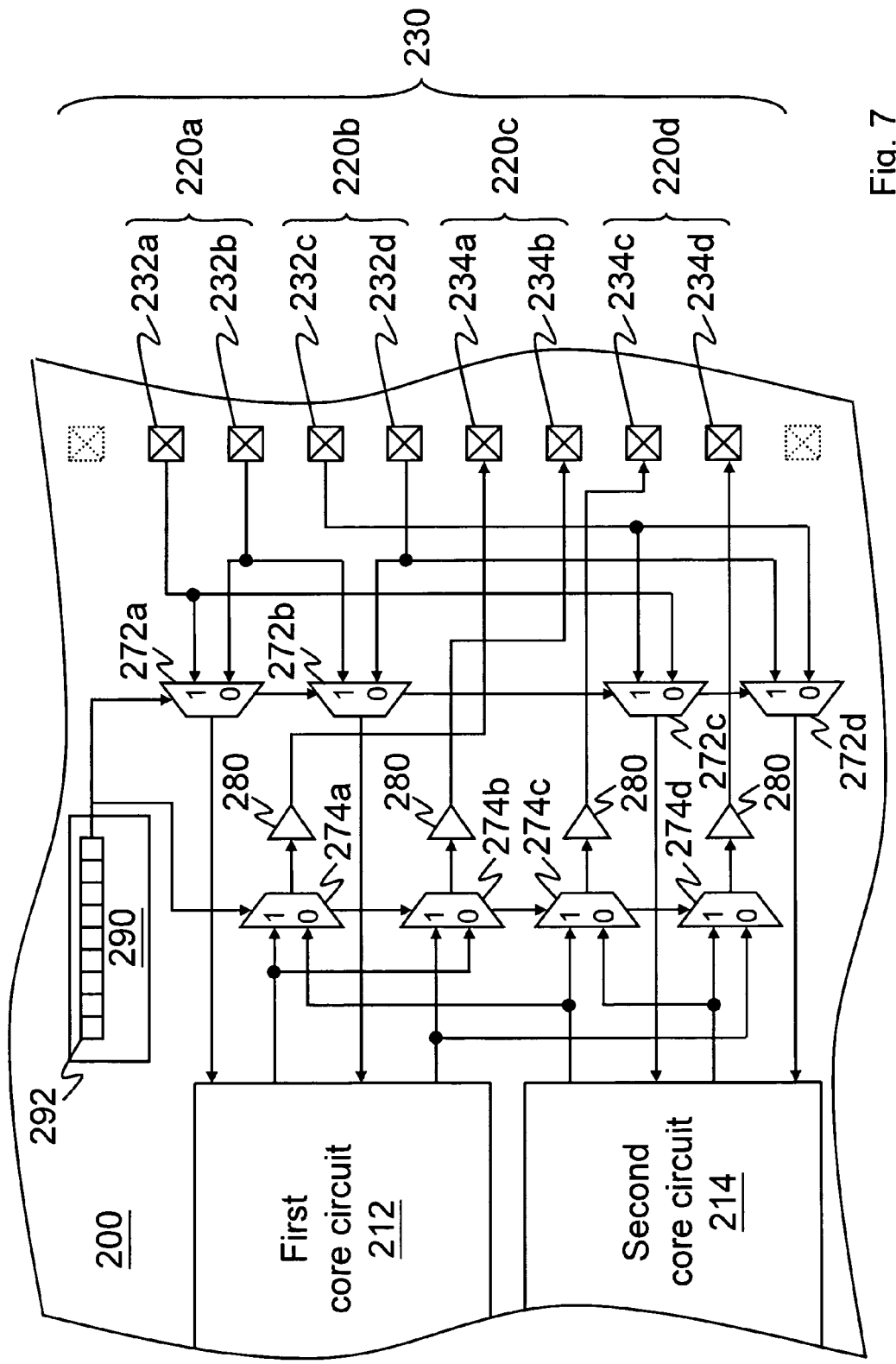
FIG. 7 is a diagram of an integrated circuit as a third embodiment of the present invention.

Please refer to FIG. 7, which is an integrated circuit 200 illustrated according to another embodiment of the present invention. The integrated circuit 200 includes multiple core circuits (hereinafter identifying the first core circuit 212 and the second core circuit 214 as examples for description), pads 230, and selection circuits 272a, 272b, 272c, 272d, 274a, 274b, 274c, and 274d.

The adjacent pads 232a, 232b/232c, 232d/234a, 234b/234c, 234d can be classified as pad groups 220a/220b/220c/220d. The pad groups 220a, 220b/220c, 220d correspond to the first core circuit 212 and the second core circuit 214, respectively.

Selection circuits 272a, 272b, 274a, 274b and 272c, 272d, 274c, 274d are coupled between the pads 230 and the first core circuit 212 and between the pads 230 and the second core circuit 214, respectively.

When the integrated circuit 200 is to be packaged with a first mode, the selection circuits 272a, 272b, 274a, 274b will connect the first core circuit 212 to pads 232a, 232b, 234a, 234b of the corresponding pad groups 220a and 220c electrically. The selection circuits 272c, 272d, 274c and 274d will connect the second core circuit 214 to pads 232c, 232d, 234c and 234d of the corresponding pad groups 220b and 220d electrically. When the integrated circuit 200 is to be packaged with a second mode, the selection circuits 272a, 272b, 272c, 272d, 274a, 274b, 274c and 274d will connect electrically the same core circuit with pads 230 residing within a predetermined distance, that is, the selection circuits 272a, 272b, 274b, 274d will connect the first core circuit 212 to pads 232b, 232d, 234b and 234d electrically, and the selection circuits 272c, 272d, 274a and 274c will connect the second core circuit 214 to pads 232a, 232c, 234a and 234c electrically; in which, the predetermined distance is a distance specified by the bonding rule.

Herein, a control circuit 290 can be used to output the control signal depending on the first mode or the second mode of packaging, i.e. according to the packaging mode to be applied for the integrated circuit 200, so as to control the switching of selection circuits 272a, 272b, 272c, 272d, 274a, 274b, 274c and 274d, i.e. selection circuits 272a, 272b, 272c, 272d, 274a, 274b, 274c and 274d will be connecting electrically the pads 230 to the core circuits, such as the first core circuit 212 and the second core circuit 214, based on the control signal; in which, control circuit 290 can be provided with a register 292 for storing the parameters required for determining for which packaging mode the integrated circuit 200 will be applied, and outputting the control signal required for controlling selection circuits 272a, 272b, 272c, 272d, 274a, 274b, 274c and 274d.

For example, selection circuits 272a, 272b, 272c, 272d, 274a, 274b, 274c and 274d can be implemented with the multiplexers. These multiplexers are coupled between the core circuits and the pads. When the integrated circuit 200 is applied in the first mode of packaging, the control signal 290 will output a control signal that represents "1" to selection circuits 272a, 272b, 272c, 272d, 274a, 274b, 274c and 274d, so that selection circuits 272a, 272b, 274a and 274b will connect electrically the first core circuit 212 to pads 232a, 232b, 234a and 234b in pad groups 220a and 220c, and selection circuits 272c, 272d, 274c and 274d will connect electrically the second core circuit 214 to pads 232c, 232d, 234c and 234d in pad groups 220b and 220d. On the contrary, when applied in the second mode of packaging, control circuit 290 will output a control signal that represents "0" to selection circuits 272a, 272b, 272c, 272d, 274a, 274b, 274c and 274d, so that selection circuits 272a, 272b, 274b and 274d will connect electrically the first core circuit 212 to pads 232b, 232d, 234b and 234d, and selection circuits 272c, 272d, 274a and 274c will connect electrically the second core circuit 214 to pads 232a, 232c, 234a and 234c.

Each core circuit, i.e. the first core circuit 212 and the second core circuit 214, is provided with one or more inputs/outputs, which are respectively coupled to the outputs and inputs of selection circuit, with which the inputs and the outputs of the core circuit mutually correspond. For example, please refer to FIG. 7, in which the input of the first core circuit 212 is coupled with selection circuits 272a and 272b, and the corresponding output is coupled with selection circuits 274a, 274b and 274d; and, the input of the second core circuit 214 is coupled with selection circuits 272c and 272d, and the corresponding output is coupled with selection circuits 274a, 274c and 274d.

A buffer 280 can be coupled between selection circuits 274a, 274b, 274c and 274d and pads 234a, 234b, 234c and 234d for buffering the signal to be outputted by core circuit (i.e. the first core circuit 212/the second core circuit 214).

Figure 8:
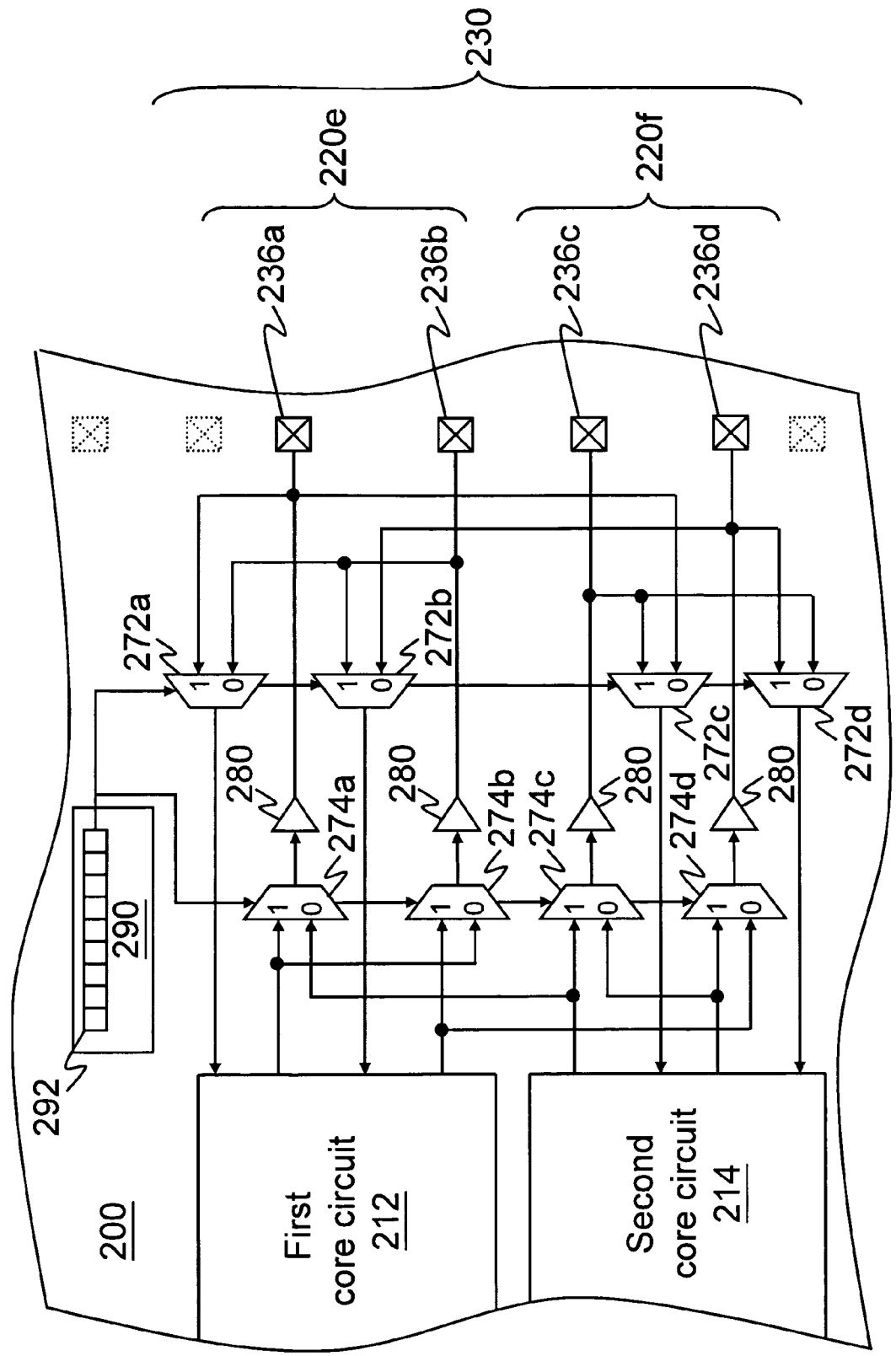
FIG. 8 is a diagram of an integrated circuit as a fourth embodiment of the present invention.

Herein, the pads 230 may be for unidirectional transmission, as shown in FIG. 7, and also for bidirectional transmission, as shown in FIG. 8. When adopting the pads 230 for unidirectional transmission, the input and output of the same core circuit (i.e. the first core circuit 212/the second core circuit 214), will be coupled with different pads 232a, 232b, 232c, 232d/234a, 234b, 234c, 234d through selection circuits 272a, 272b, 272c, 272d, 274a, 274b, 274c and 274d, as shown in FIG. 7.

When adopting pads 236a, 236b, 236c, 236d for bidirectional transmission, the input and output of the same core circuit (i.e. the first core circuit 212/the second core circuit 214), will be coupled with the same pads 236a, 236b, 236c and 236d through selection circuits 272a, 272b, 272c, 272d, 274a, 274b, 274c and 274d, as shown in FIG. 8. Moreover, when integrated circuit 200 is applied in the first mode of packaging, the first core circuit 212 will be connected electrically with pad group 220e, and the second core circuit 214 will be connected electrically with pad group 220f; and, when integrated circuit 200 is applied in the second mode of packaging, the first core circuit 212 and the second core circuit 214 will be sequentially and alternately connected electrically with pads 236a, 236b, 236c and 236d. In this case, although the above example presents that the cores circuit 212 and the second core circuit 214 are connected sequentially and alternatively with pads 236a, 236b, 236c, and 236d, it is in fact only required that the distance between pads coupled with the same core circuit match the predetermined distance specified by the bonding rule.

Therefore, the integrated circuit 200 can be applied in multiple modes of packaging. For instance, when the integrated circuit 200 (hereinafter referred to the first integrated circuit 200 for convenience) is applied in a single-die packaging, referring to FIGS. 8 and 9, the integrated circuit 200 will be configured on substrate 302 of the first package body 300, and the pads 230 on the first integrated circuit 200 will be connected electrically to leads 312a, 312b, 312c, 312d, 312e, 312f, 312g, 312h and 312i on substrate 302; wherein, pads of pad group 220f will be connected electrically to leads 512a, 512b, 512c, 512d and 512e of the second package body 500 through leads 312e, 312f, 312g, 312h and 312i, and pads of pad group 220e will be connected electrically to leads 610a, 610b, 610c and 610d of the third package body 600 through leads 312a, 312b, 312c and 312d. Generally speaking, the first, second and third package bodies 300, 500, 600 will all be configured on one printed circuit board. At this time, selection circuits 272a, 272b, 272c, 272d, 274a, 274b, 274c and 274d will connect electrically the first core circuit 212 with pad group 220e, and connect electrically the second core circuit 214 with pad group 220f; in this case the second package body 500 may be an SDRAM with another integrated circuit (hereinafter referred as the second integrated circuit 400 for convenience) wherein the first integrated circuit 200 can be connected to the pad on the second integrated circuit 400 through the pad group 220f, leads 312e, 312f, 312g, 312h and 312i, and leads 510a, 510b, 510c, 510d and 510e, so that the second core circuit 214 can access the data stored on the second integrated circuit 400; and, the third package body 600 may be a functional circuit, wherein the first integrated circuit 200 can be connected to leads 610a, 610b, 610c and 610d of the third package body 600 through pad group 220e and leads 312a, 312b, 312c and 312d to control the operation of the third package body 600.

Figure 10:
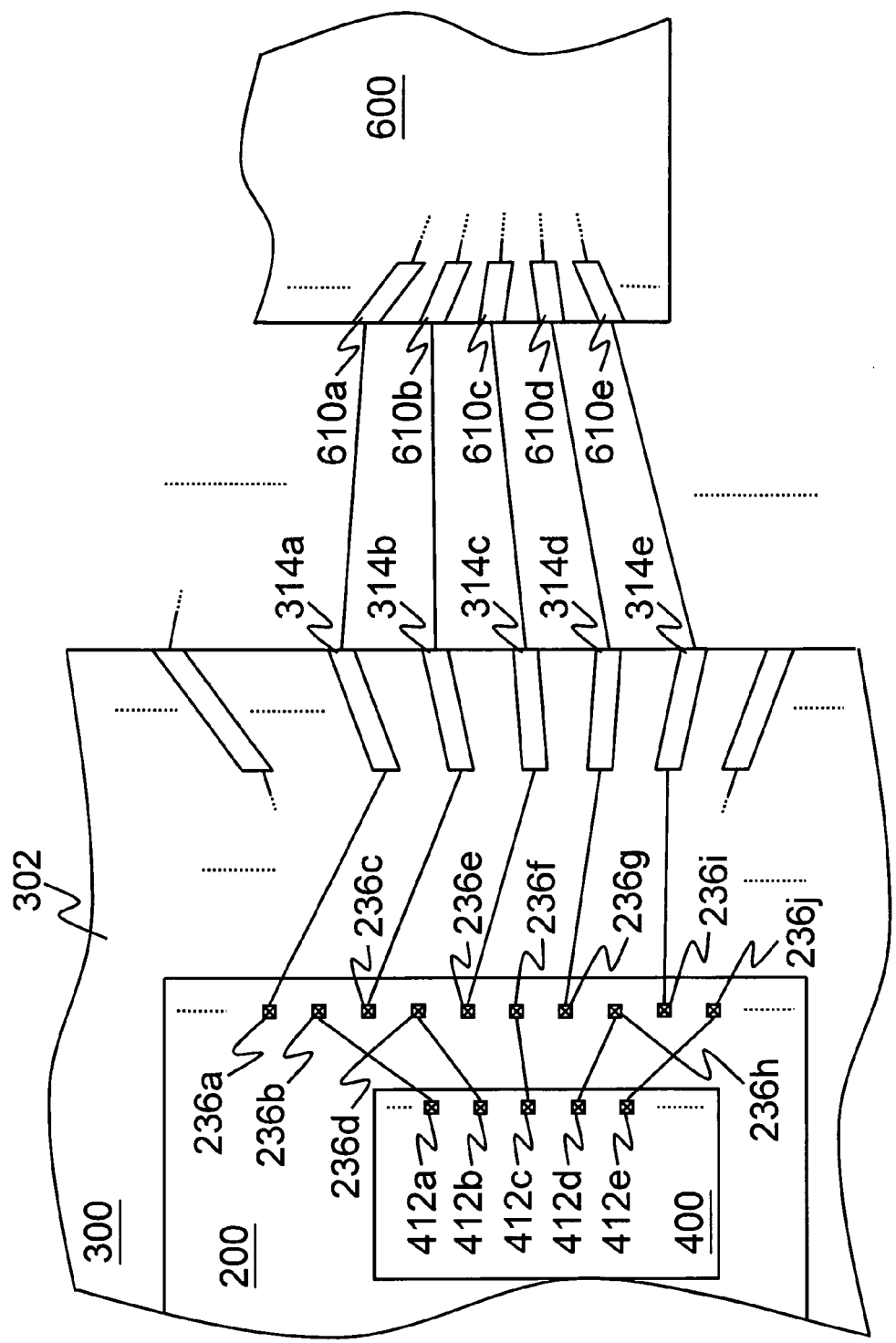
FIG. 10 is a structural diagram of an integrated circuit in FIG. 8 within a multi-die packaging; and, FIG. 11 is a diagram of an integrated circuit as a fifth embodiment of the present invention.

When integrated circuit 200 (hereinafter referred to the first integrated circuit 200 for convenience) is applied in a multi-die packaging (referring to FIGS. 7, 8 and 10), the first integrated circuit 200 is configured on substrate 302 of the first package body 300, and another integrated circuit (hereinafter referred as the second integrated circuit 400 for convenience), such as a memory die is configured on the first integrated circuit 200. Herein, the first integrated circuit 200 will be connected electrically with pads 412a, 412b, 412c, 412d and 412e of the second integrated circuit 400 through pads 236b, 236d, 236f, 236h and 236j, and the non-adjacent pads 263a, 236c, 263e, 236g and 236i on the first integrated circuit 200 will be connected electrically to leads 610a, 610b, 610c, 610d and 610e of the third package body 600 through leads 314a, 314b, 314c, 314d and 314e configured on substrate 302 of the first package body 300, so as to control the operation of the third package body 600. At this time, selection circuits 272a, 272b, 272c, 272d, 274a, 274b, 274c and 274d will connect electrically the pads 230 of the same core circuit but not the adjacent ones. For example, selection circuits 272a, 272b, 274b, 274d will connect electrically the first core circuit 212 with pads 232b, 232d, 234b and 234d, and selection circuits 272c, 272d, 274a and 274c will connect electrically the second core circuit 214 with pads 232a, 232c, 234a and 234c.

According to the foregoing descriptions, the design of switching the bonding connected to pads of the same integrated circuit to pads separated with a predetermined distance or with intervening pads makes the integrated circuit (or die) compliant with bonding rules when multi-die packaging is applied. Also, in the single-die packaging mode, the pads connected to the same external packaging body can be switched to configurations that make them concentrated and sequential, such that the circuit layout on a printed circuit board is carried out in more convenience.

Figure 11:
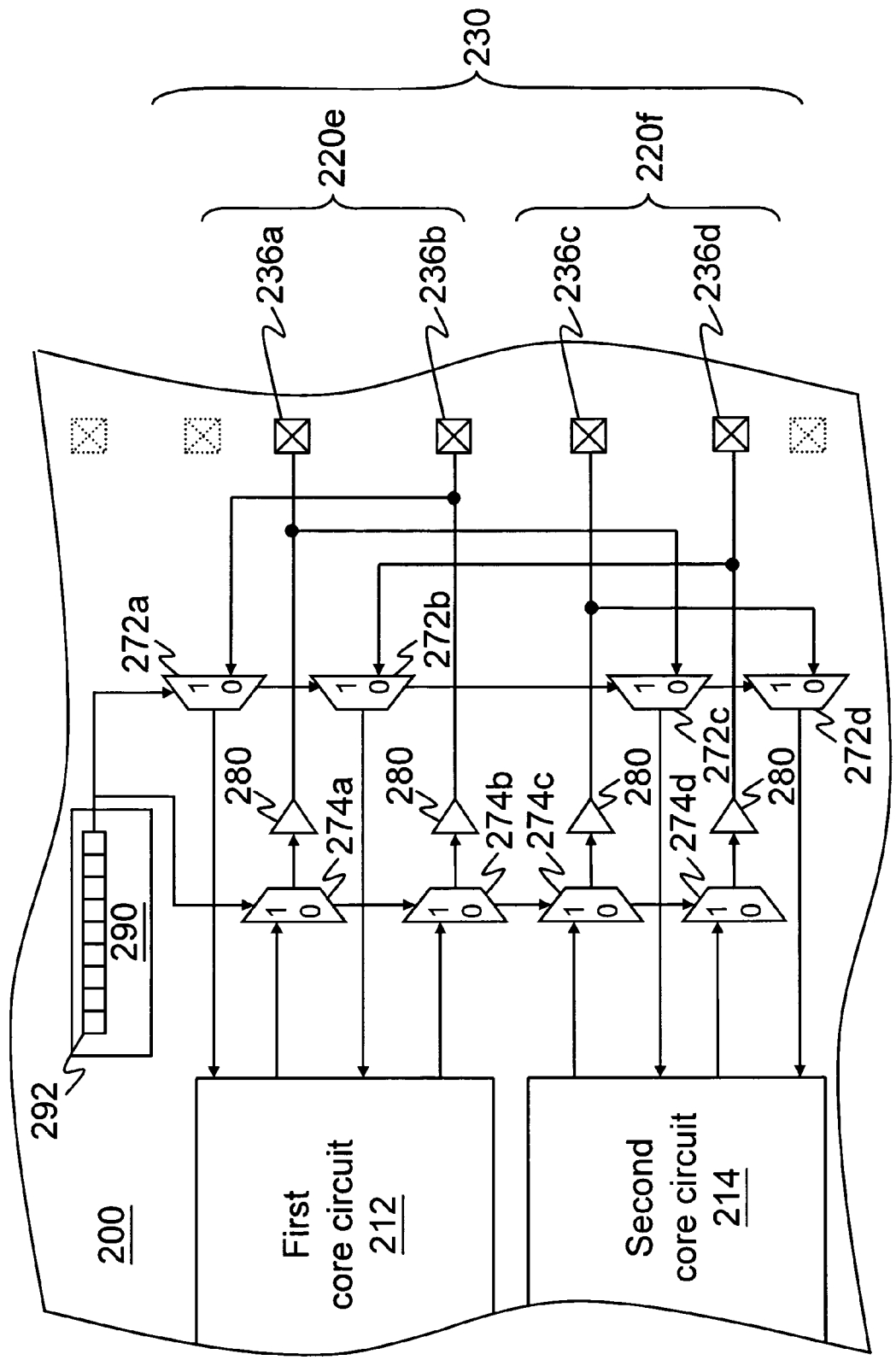

In another embodiment, pad 230 may belong to the input pad under a certain mode, and belong to the output pad under another mode, as shown in FIG. 11. In the present embodiment, when control circuit 290 outputs a control signal "1" to selection circuits 274a, 274b, 274c and 274d, selection circuits 274a and 274b will connect electrically the output of the first core circuit 212 with pads 236a and 236b. Similarly, selection circuits 274c and 274d will connect electrically the output of the second core circuit 214 with pads 236c and 236d. Therefore, in the present embodiment, under the mode with control signal "1", pads 230 are output pads. In this case, when the integrated circuit 200 is applied in a packaging mode with control signal "1", the first core circuit 212 and pad group 220e will be connected electrically, and the second core circuit 214 and pad group 220f will be connected electrically.

Conversely, when control circuit 290 outputs a control signal "0" to selection circuits 272a, 272b, 272c and 272d, selection circuits 272a and 272b will connect electrically the input of the first core circuit 212 to pads 236b and 236d. Similarly, selection circuits 272c and 272d will connect electrically the input of the second core circuit 214 to pads 236a and 236c. Thus, in the present embodiment, under the mode with control signal "0", pads 230 are input pads. Herein, when integrated circuit 200 is applied in a packaging mode with control signal "0", the first core circuit 212 and the second core circuit 214 will be sequentially and alternately connected electrically with pads 236a, 236b, 236c and 236d.

Figure 9:
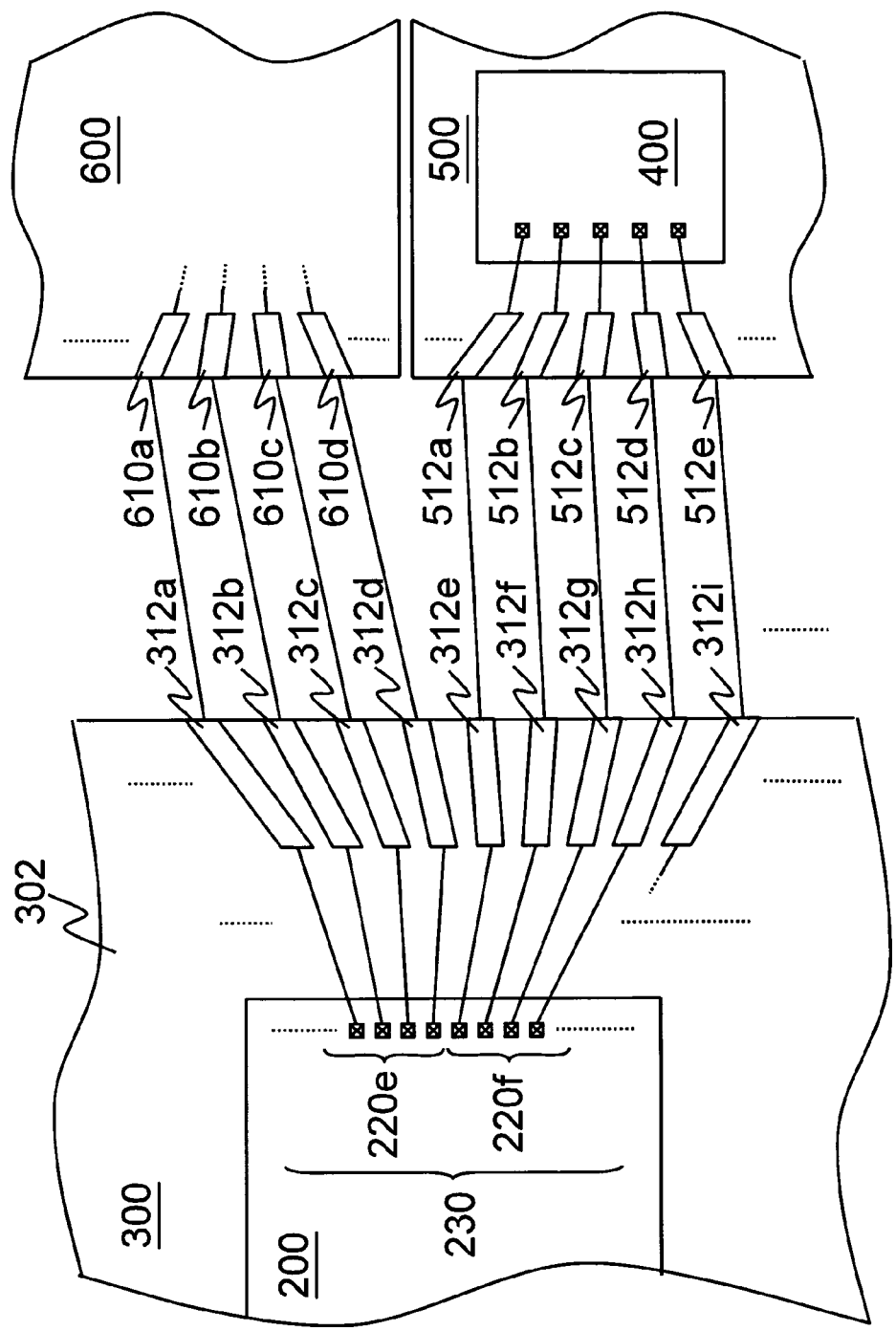
FIG. 9 is a structural diagram of an integrated circuit in FIG. 8 within a single-die packaging.

Thus, the example in FIG. 11 can be applied in single-die packaging by changing the control signal to "1" (please refer to detailed descriptions of FIG. 9). Conversely, when the control signal is "0", it can be applied in multi-die packaging (please refer to detailed descriptions of FIG. 10).

As mentioned above, the embodiments in FIG. 3-6 differ from the embodiments in FIG. 7-11 in at least the following ways: the former has some pads located at the positions in the integrated circuit closer to the inner side, which is convenient for the connection of the multi-die package with the other dies within the same package body; and the latter places all pads on the edge of the integrated circuit, and employs a sequential and alternate pad arrangement to meet the requirement of the bonding rule for multi-die packaging. However, regardless of the method of implementation, the present invention employs the circuit design for selecting different signals based on different packaging, so that a single chip can support different product applications, and further improve the application flexibility of the chip, effectively reducing the number of pads and the chip area. For example, if an application is a single-die package with 208 pins, in which 80 pins are the butted signals for another specific chip, the conventional method must have at least 208 external pads and 80 internal pads, in total 288 pads; but according to the present invention, the chip needs only 208 pads going without the additional 80 pads, and may even reduce the package body into a 128 pins package; or it may keep 288 pads, but when employing multi-die packaging, additional pins for the 80 pads will be available, which can be used to output other application signals, providing additional product functions.

Although the present invention has been disclosed with the above-mentioned preferred embodiments, they are not used to limit the present invention. Those proficient in this field may apply certain changes and modifications without departing from the spirit and scope of the present invention. The patented protection scope of the present invention should therefore be defined by the claims attached in the specification.

What is claimed is:

1. An integrated circuit for various packaging modes, comprising:
   a core circuit;
   a plurality of pads; and,
   a selection circuit, coupled between the core circuit and the pads for determining a connection state of the core circuit with the pads according to a control signal, the control signal indicating whether the integrated circuit is operable within a single-die package or a multi-die package;
   wherein the integrated circuit is controlled by the selection circuit to be operational in the single-die package when the connection state is in a first connection state according to the control signal, and is controlled by the selection circuit to be operational in the multi-die package when the connection state is in a second connection state according to the control signal.

2. The integrated circuit of claim 1, wherein the pads comprise:
   a plurality of first pads, to be coupled to external circuitry; and a plurality of second pads, to be coupled to another internal die;

wherein the core circuit is coupled with at least one of the first pads and at least one of the second pads, and wherein the selection circuit is coupled with at least one of the first pads and at least one of the second pads.

3. The integrated circuit of claim 2, wherein the selection circuit enables electrical connection between the core circuit and a corresponding first pad of the first pads when the integrated circuit is operational in the single-die package.

4. The integrated circuit of claim 2, wherein the selection circuit enables electrical connection between the core circuit and a corresponding second pad of the second pads when the integrated circuit is operational in the multi-die package.

5. The integrated circuit of claim 1, wherein the selection circuit is a multiplexer with a plurality of inputs connected with corresponding pads, an output connected with the core circuit, and a control terminal receiving the control signal.

6. An integrated circuit, comprising:
a plurality of pads;
a core circuit, comprising an input and an output, wherein the output is coupled to two of the pads;
a control circuit, to output a control signal according to one of two desired modes, wherein the two desired modes are associated with a first packaging mode and a second packaging mode, respectively, wherein the first packaging mode comprises multi-die packaging and the second packaging mode comprises single-die packaging; and
a selection circuit, coupled between the two pads and the input to connect the input with one of the two pads electrically according to the control signal, wherein the input is connected to the one of the two pads when the integrated circuit operates within a single-die package, otherwise the input is connected to the other of the two pads when the integrated circuit operates within a multi-die package.

7. The integrated circuit of claim 6, wherein the pads comprise:
a plurality of first pads, to be coupled to external circuitry; and
a plurality of second pads, to be coupled to another internal die;
wherein the output is coupled with at least one of the first pads and at least one of the second pads; and wherein the selection circuit is coupled with at least one of the first pads and at least one of the second pads.

8. The integrated circuit of claim 7, wherein the selection circuit enables electrical connection between the input and a corresponding second pad of the second pads for the multi-die packaging.

9. The integrated circuit of claim 7, wherein the selection circuit enables electrical connection between the input and a corresponding first pad of the first pads for the single-die packaging.

10. The integrated circuit of claim 6, wherein the output and the selection circuit are coupled with different pads when unidirectional transmission is desired.

11. The integrated circuit of claim 6, wherein the output and the selection circuit are coupled with the same pads when bidirectional transmission is desired.

12. The integrated circuit of claim 6, wherein the selection circuit is a multiplexer with a plurality of inputs connected with corresponding pads, an output connected with the input of the core circuit, and a control terminal coupled to the control circuit.

13. The integrated circuit of claim 6, wherein the output is coupled to the pads through a buffer.

* * * * *